United States Patent
Wang et al.

(10) Patent No.: US 6,862,723 B1
(45) Date of Patent: Mar. 1, 2005

(54) METHODOLOGY OF GENERATING ANTENNA EFFECT MODELS FOR LIBRARY/IP IN VLSI PHYSICAL DESIGN

(75) Inventors: Chung-Hsing Wang, Baushan (TW); Daisy Wang, Changhua (TW); Chia Ling Cheng, Tao-Yuan (TW); Lee Chung Lu, Taipei (TW); Cliff Hou, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 208 days.

(21) Appl. No.: 10/263,542

(22) Filed: Oct. 3, 2002

(51) Int. Cl.[7] ............................. G06F 17/50; G06F 9/45
(52) U.S. Cl. ............................. 716/13; 716/5; 716/10
(58) Field of Search ........................ 716/1–5, 7–17

(56) References Cited

U.S. PATENT DOCUMENTS

| | | | |
|---|---|---|---|
| 5,966,517 A | 10/1999 | Cronin, III et al. | 395/500.02 |
| 6,292,927 B1 | 9/2001 | Gopisetty et al. | 716/11 |
| 6,308,308 B1 | 10/2001 | Cronin, III et al. | 716/8 |
| 6,496,959 B1 * | 12/2002 | Noguchi | 716/4 |
| 6,502,226 B2 * | 12/2002 | Ishikura | 716/7 |
| 6,557,155 B2 * | 4/2003 | Nagayoshi et al. | 716/14 |
| 6,594,809 B2 * | 7/2003 | Wang et al. | 716/10 |
| 6,622,293 B1 * | 9/2003 | Suzuki et al. | 716/12 |
| 2004/0078767 A1 * | 4/2004 | Burks et al. | 716/8 |

* cited by examiner

Primary Examiner—Leigh M. Garbowski (57) ABSTRACT

A new method to route a metal line in the layout of an integrated circuit device is achieved. The method comprises providing a layout for an integrated circuit device comprising an array of placed standard cells. Contact/via layer polygons are placed for coupling the standard cells. A line is routed in a metal layer. An antenna effect value is calculated for the line using parameters previously determined from the layout of each the standard cell. The parameters comprise gate area, diode area, metal area, and contact/via area coupled to the line. The gate area, the diode area, the metal area, and the contact/via area are segregated by metal level. The steps of routing and calculating are repeated if the antenna effect value exceeds a specified value. A method to extract parameters is disclosed.

20 Claims, 7 Drawing Sheets

METHODOLOGY OF GENERATING ANTENNA EFFECT MODELS FOR LIBRARY/IP IN VLSI PHYSICAL DESIGN

BACKGROUND OF THE INVENTION (1) Field of the Invention

The invention relates to an automated design methodology and, more particularly, to a method to generate antenna effect models for standard library components for use by automatic placement and routing software.

(2) Description of the Prior Art

Integrated circuits are typically fabricated using a plurality of layers comprising different materials. These layers are formed or deposited using a variety of different processes. Frequently, these deposited layers must be further patterned to form final designs. This patterning is performed using etching processes. A particular etching process of importance in the present invention is plasma etching.

Plasma etching processes comprise a gas ion plasma that is used to etch an exposed layer on an integrated circuit. These plasma etching processes may exhibit high selectivity as well as fine direction control (anisotropy). A well known problem with plasma etching, however, is film charging. In film charging, metal or polysilicon films can become charged by the plasma. This charging is thought to be caused by non-uniformity in the plasma. The accumulation of charge can cause a large voltage potential to develop in the film. Further, the amount of charging is proportional to the exposed area of the film and is, therefore, called the antenna effect.

Figure 1:
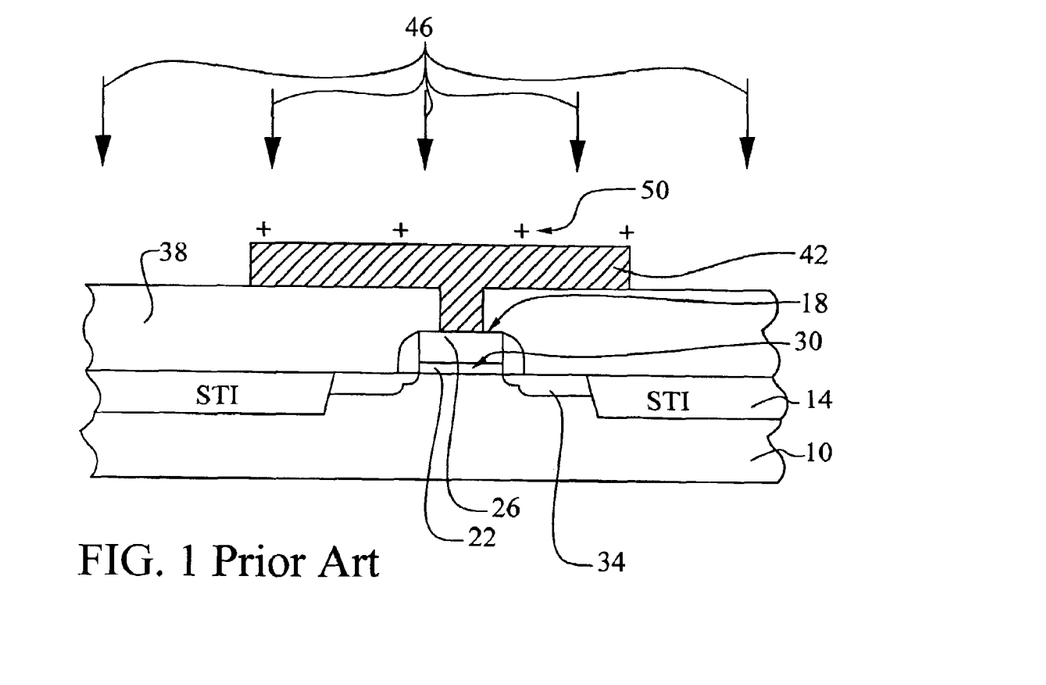
FIG. 1 illustrates a cross section of a partially completed integrated circuit device showing the plasma-induced charging effect.

Referring now to FIG. 1, a cross section of a partially completed integrated circuit device is shown. In this simplified example, a MOS transistor has been formed in substrate 10. The MOS gate 18 is coupled to a metal layer 42. During a plasma etching process 46, charging 50 occurs in the metal layer film 42. The charge 50 on the metal film 42 is effectively coupled to the polysilicon gate electrode 26 of the MOS transistor. If the presence of the charge 50 induces a large voltage difference between the gate electrode 26 and the substrate 10, then this voltage must be sustained over the relatively thin gate oxide layer 22. In a sub-micron process, the gate oxide layer 22 may be in the range of about 40 Angstroms. The large voltage caused by the plasma-induced charging of the metal film 42 appears as an electrical overstress (EOS) or electrostatic discharge (ESD) event 30 to the gate oxide layer 22. It is found that the plasma-induced charging can cause gate oxide 22 failures.

Figure 2:
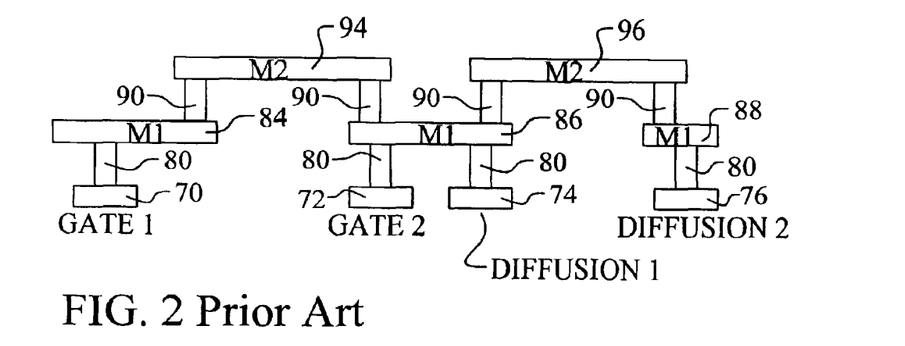
FIG. 2 illustrates several layers of an integrated circuit device in a very simplified cross section to show various metal line routings and gate and diode couplings.

Referring now to FIG. 2, several layers of an integrated circuit device are shown in a very simplified cross section. In the cross section, two gates, GATE1 70 and GATE2 72 and two diffusion regions, DIFFUSION1 74 AND DIFFUSION2 76, are shown. Metal lines are formed in two metal layers comprising METAL1 (M1) and METAL2 (M2). Contacts 80 are used to couple M1 lines 84, 86, and 88, to the underlying gates and diffusions 70, 72, 74, and 76. Vias 90 are used to couple M1 lines to overlying M2 lines 94 and 96. Interconnect paths are thereby formed using the two metal levels M1 and M2.

As discussed above, the magnitude of charge coupled onto a metal line is proportional to the area of that metal line according to the antenna effect. For example, the antenna effect for the M1 line 84 coupled to GATE1 70 is proportional to the area of the M1 line 84. Note that GATE1 70 is electrically coupled to GATE2 72 using a routing of a contact 70, M1 84, a via 90, M2 94, another via 90, M1 86, and contact 80. This routing could also have been achieved by simply routing from GATE1 70 to GATE2 72 using only the M1 line 84. Note, however, that this would increase the total area of M1 coupled directly to GATE1 70 and GATE2 72. Therefore, the antenna effect for a proposed M1 line coupling directly between GATE1 70 and GATE2 72 would have a greater antenna effect during M1 plasma exposure than the more complex routing shown. It is well known in the art that the antenna effect value for a given routing can be reduced by distributing the routing between several metal layers as shown.

In addition to coupling the gates 70 and 72, the illustrated section shows additional couplings to diffusion regions 74 and 76. These diffusion regions may comprise, for example, source and drain regions of MOS transistors. For example, DIFFUSION1 74 AND DIFFUSION2 76 may comprise the drains of NMOS and PMOS transistors. In a complex logic function, such drains are often further coupled to gates such as GATE1 70 and GATE2 72 by metal routings. The presence of diffusion regions coupled to the metal lines has a large effect on the plasma charging problem. For example, if plasma charging occurs on the M1 86, the DIFFUSION2 region 76 can shunt charge through the substrate. This will effectively clamp the voltage across GATE2 72 and can prevent EOS or ESD damage to this gate. The effect of diffusion regions in reducing plasma-induced ESD has been well demonstrated in the art.

The tradeoff between metal line routing and the presence of diffusion regions has been characterized in the art. Layout rules and design rule checks (DRC) have been implemented to insure that potential plasma-induced ESD damage is avoided. In particular, an antenna ratio may be calculated for any metal line routing. The antenna ratio is defined as the metal line, sidewall area divided by the gate area coupled to that metal line. For example, the M1 line 84 coupled to GATE1 70 has a sidewall area defined by 2×line length×M1 thickness. The area of GATE1 70 is defined by gate length× gate width. Therefore, it is relatively straightforward to calculate the antenna effect ratio for M1 84. This antenna effect ratio can then be compared to a limiting value that has been developed for the process. If the calculated antenna effect ratio exceeds the allowable limit, then the signal needs to be re-routed. For example, part of the routing may need to be moved to M2 to reduce the M1 sidewall area as discussed above.

The effect of diffusion regions coupled to the metal line is taken into account by increasing the allowable limit. For example, the M1 line 86 is coupled to GATE2 72 and to DIFFUSION1 74. The antenna ratio is calculated by dividing the sidewall area of M1 86 by the area of GATE2 72. The allowable limit for the antenna ratio is then increased to account for this diffusion, or diode, area attached to the metal line. The limit is therefore given by:

$$\text{LIMIT} + K \times \text{diode area,}$$

where LIMIT is the standard antenna effect limit without any diffusions. It is well-known in the art that the antenna effect can be reduced by the presence of diffusion regions. Typically the diode area is nulled if it is smaller than a specified area.

Figure 3:
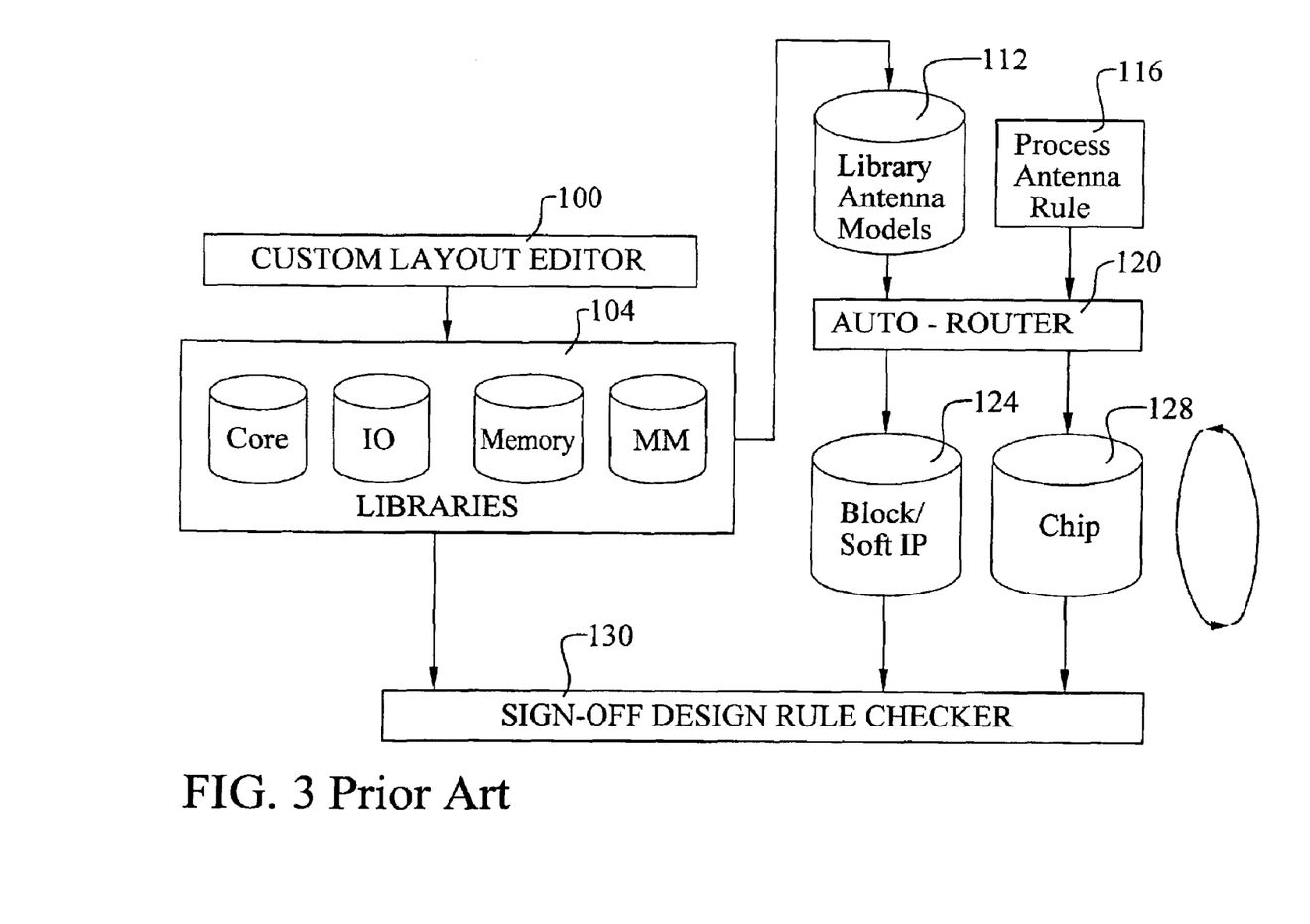
FIG. 3 illustrates an integrated circuit design architecture.

Referring now to FIG. 3, an integrated circuit design architecture is shown. This architecture illustrates a standard cell-based design methodology. In this methodology, a variety of needed standard circuit sub-blocks or standard cells are held in libraries 104. These standard cells are laid out using a custom layout editor 100. The standard cell libraries 104, such as core logic or input output (IO) are checked using a design rule check (DRC) program 130 to insure that they are free from any rule violations regarding layer sizes, spacings, overlap, etc. The antenna effect rule may also be checked for each of these library 104 components using the DRC step 130. After the standard cells pass the DRC process 130, they are released to the library 104 for use.

An automatic placement program is used to place these standard cell components from the libraries 104 into a working IC layout. After placement, an automatic router program 120 is used to route metal lines between the standard cells to complete the design in accordance with the chip-level, circuit netlist. The automatic router 120 generates block/soft IP layout 124 routings as well as chip-level routings 128. These routings are then checked using the DRC program 130. These routed layouts must pass the DRC program 130 to be released for mask design.

The auto-router program 120 can use library antenna models 112 and the process antenna rule 116 to guide the routing process. That is, the router program 120 proposes signal routings to couple the pre-placed standard cells as directed by the netlist. Each proposed routing is then checked against the process, antenna effect rule 116 that has been established for the IC technology that will be used to fabricate the device. This process rule 116 comprises the equations used to generate the antenna effect ratio and ratio limit as described above. The library antenna models 112 allow some limited information regarding the standard library cells 104 to be included in the process rule calculation performed by the auto-router. In this architecture, the auto-router program 120 attempts to find routings that implement the netlist and that will pass the DRC check 130. If the auto-router 120 generated layout does not pass the DRC check 130, it must be re-done.

Figure 4:
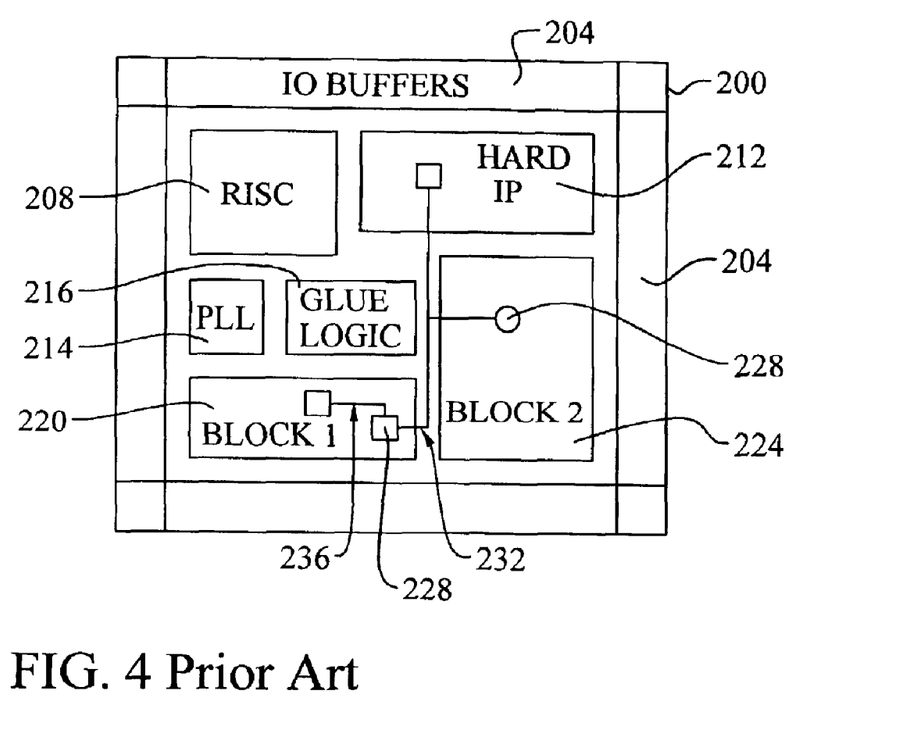
FIG. 4 illustrates an exemplary chip layout.

Referring now to FIG. 4, an exemplary chip layout is shown. This integrated circuit device 300 comprises a number of different types of circuit blocks. An input/output (IO) block 204 comprises a plurality of I/O pads and supporting circuit devices. Several additional blocks make up the core, including a RISC block 208, a hard IP block 212, a PLL 214, Block 1 220, Block 2 224, and a glue logic block 216. Each of these blocks may be generated using a plurality of standard cells that are placed and routed as described above. At this level of the layout process, however, it assumed that the various blocks may be treated as components from the library as described in FIG. 3.

Referring again to FIG. 4, the automatic place and route software arranges the various blocks shown to optimize the layout and then begins to route signal lines 232 between the various blocks as defined by the design netlist. As the signal routing 232 is made from a cell pin 228 of one block to a cell pin 228 of another block, the routing software can calculate the antenna effect ratio for the routing and verify that the ratio does not exceed the specified limit. However, the calculation that can be performed by the router is severely limited because the routing program has very limited information on the contents of the blocks that are being routed. For example, the gate area and source/drain area coupled to the pin 228 may be extracted from a SPICE netlist of the block. However, the netlist contains no information on the metal routings 236 used within the block. Further, no information is available to the router regarding which metal level, or levels, are coupled to these gate and source/drain areas.

Figure 5:
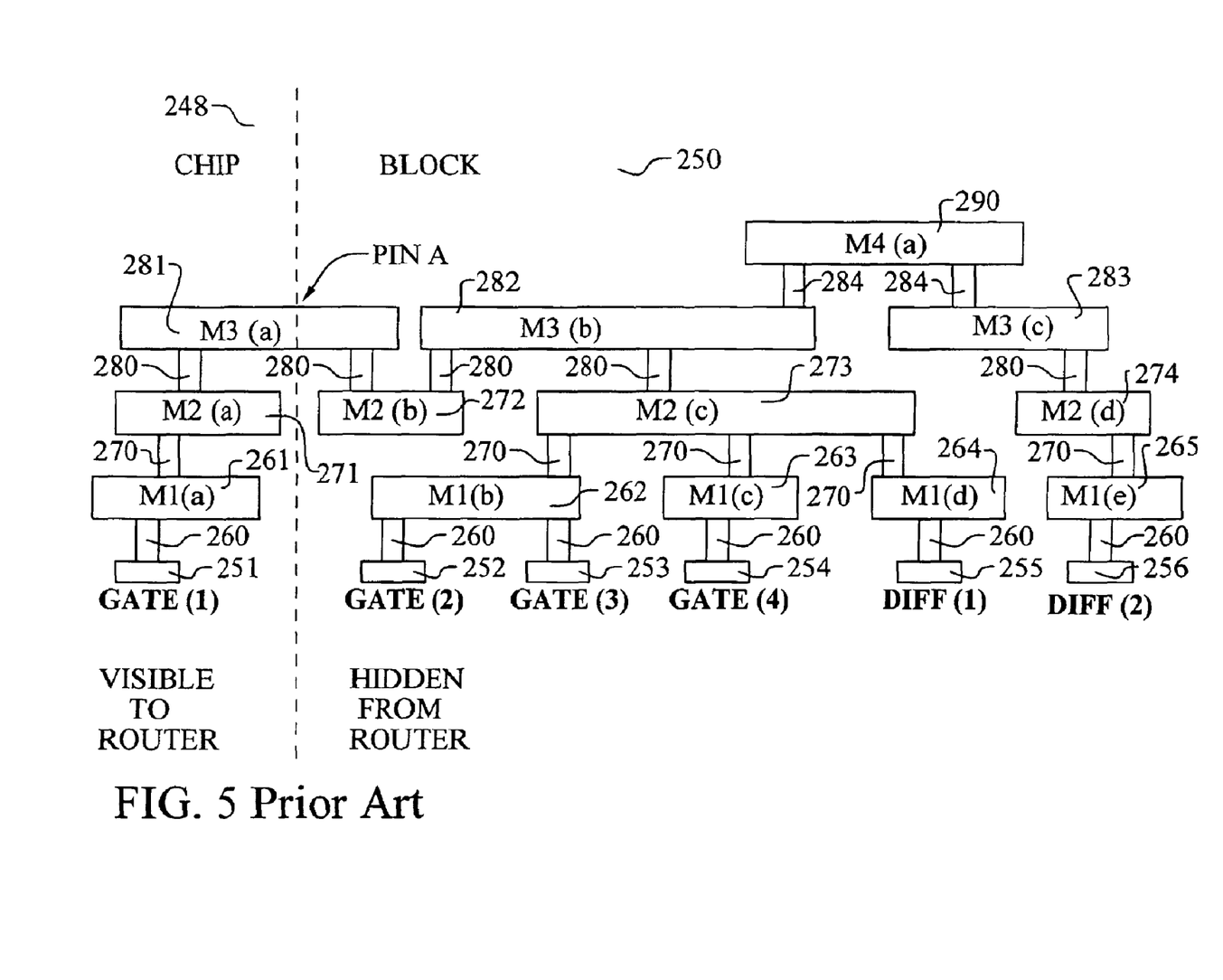
FIG. 5 illustrates an example of the interface between a block and the chip-level routing.

Referring now to FIG. 5, an example of the interface between a block 250 and the chip-level 248 is shown in cross section. As can be seen, the chip-level 248 routing information necessary for evaluation of the antenna effect at pin A is visible to the routing program. In particular, the routing program can evaluate the gate area due to GATE(1) 251, the absence of a diffusion area, and the areas of M1 261, M2 271, and M3 281. However, the routing program has no visibility regarding the antenna effect information within the block 250. The routing program may use the netlist to conclude that GATE(2), GATE(3), GATE(4), DIFF(1), and DIFF(2) are coupled to pin A. However, the router cannot know the complex arrangement of metal layers M1, M2, M3, and M4, used within the block.

Referring again to FIG. 3, the routing program 120 attempts to generate a routing layout that will pass the antenna effect checking in the DRC program 130. However, as has been described above, the routing program 120 has limited information on the internal contents of the blocks that it is routing. Therefore, the routing program 120 can easily create a routing that appears to meet the antenna effect requirements during the routing analysis but that fails the final DRC check 130. If this happens, the time consuming routing process must be repeated. This process of routing and DRC checking may require several, time consuming iterations or human interventions to complete.

To avoid the iteration process, the designer is tempted to use very conservative models 112 for the block pins. In other words, a worst case internal metal area is assumed for each pin. This approach can help to prevent final DRC failures of completed routing due to antenna effect violations. However, by using a very conservative model, that may be completely too conservative for many of the block pins, the routing program is forced to work very hard to find "bullet proof" routes for every inter-block routing so that the DRC is certain to pass it. This causes unacceptably long routing program times. In addition, the routing program will sometimes fail to find any acceptable routing that will fix all of the antenna violations that the too conservative model causes. A means of providing a more accurate model of the antenna effect parameters pertinent to the block pins would eliminate these routing problems.

Several prior art inventions relate to plasma-induced, ESD due to the antenna effect. U.S. Pat. No. 6,308,308 B1 to Cronin, III et al, and U.S. Pat. No. 5,966,517 to Cronin, III et al teach a method to prevent plasma-induced, ESD damage in a standard cell based IC. Placeholders for antenna diodes are designed into each standard cell input. After placement and routing, a determination is made as to where antenna diodes are needed in the standard cells for ESD protection. The antenna diode placeholders are replaced at these locations with real diodes. U.S. Pat. No. 6,292,927 B1 to Gopisetty et al discloses a method to optimally select the best discharge paths for metal lines to reduce plasma-induced charging.

SUMMARY OF THE INVENTION

A principal object of the present invention is to provide an effective method to route metal lines in a standard cell integrated circuit device.

A further object of the present invention is to provide a method to avoid plasma-induced EOS and ESD damage by controlling the antenna effect in the routing of metal lines in a standard cell circuit device.

A yet further object of the present invention is to provide a method to avoid the antenna effect by pre-determining effect parameters in the standard cell layout prior to placement and routing and then passing these parameters to the routing program.

Another further object of the present invention is to provide parameters such as gate area, diode area, metal area, and contact/via area for each metal and contact/via layer to thereby improve the quality of antenna effect ratio calculations by the router.

Another further object of the present invention is to provide a method to route signal lines whereby an antenna effect calculation having improved accuracy enables improved routing performance.

Another yet further object of the present invention is to provide a method to route signal lines that will improve the efficiency of the automatic router and that will improve the pass rate during final DRC checking.

Another yet further object of the present invention is to provide a method to perform the parameter extraction that is efficient and effective for later antenna effect calculation.

In accordance with the objects of this invention, a method to route a metal line in the layout of an integrated circuit device is achieved. The method comprises providing a layout for an integrated circuit device comprising an array of placed standard cells. Contact/via layer polygons are placed for coupling the standard cells. A line is routed in a metal layer. An antenna effect value is calculated for the line using parameters previously determined from the layout of each of the standard cell. The parameters comprise gate area, diode area, metal area, and contact/via area coupled to the line. The gate area, the diode area, the metal area, and the contact/via area are segregated by metal level. The steps of routing and calculating are repeated if the antenna effect value exceeds a specified value.

Also in accordance with the objects of this invention, a method to determine parameters from the layout of a standard cell prior to placement and routing is achieved. The method comprises reading a standard cell layout. Gate and diode polygons are formed. The contact layer is designated as current contact/via layer, and the lowest metal layer is designated as current metal layer. Polygons are then formed in the current contact/via layer where the polygons intersect gates and diodes. Parameters are then extracted using a method comprising, first, forming lines in the current metal layer intersecting the current contact/via layer polygons. Next, gate area, diode area, and metal area are extracted where coupled to a pin of the standard cell. The next contact/via layer is designated as the new current contact/via layer. Polygons are then formed in the current contact/via layer intersecting the current metal layer. Gate area, diode area, and contact/via area are extracted where coupled to a pin of the standard cell. The next metal layer is designated as the new current metal layer. Finally, the step of extracting the parameters is repeated until the current metal layer equals top metal layer. Gate area, diode area, metal area, and contact/via areas are then extracted where coupled to a pin of the standard cell.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to extract antenna effect parameters from a standard cell or block of an integrated circuit device prior to placement and routing. The extraction method systematically analyzes the cell layout to generate parameters corresponding to each pin connection of the cell. These parameters are then available to a placement and routing program to facilitate more accurate calculation of antenna effect ratios and limits for each routed signal line. A method to use these parameters in the routing of signal lines is also disclosed. It should be clear to those experienced in the art that the present invention can be applied and extended without deviating from the scope of the present invention.

Figure 6:
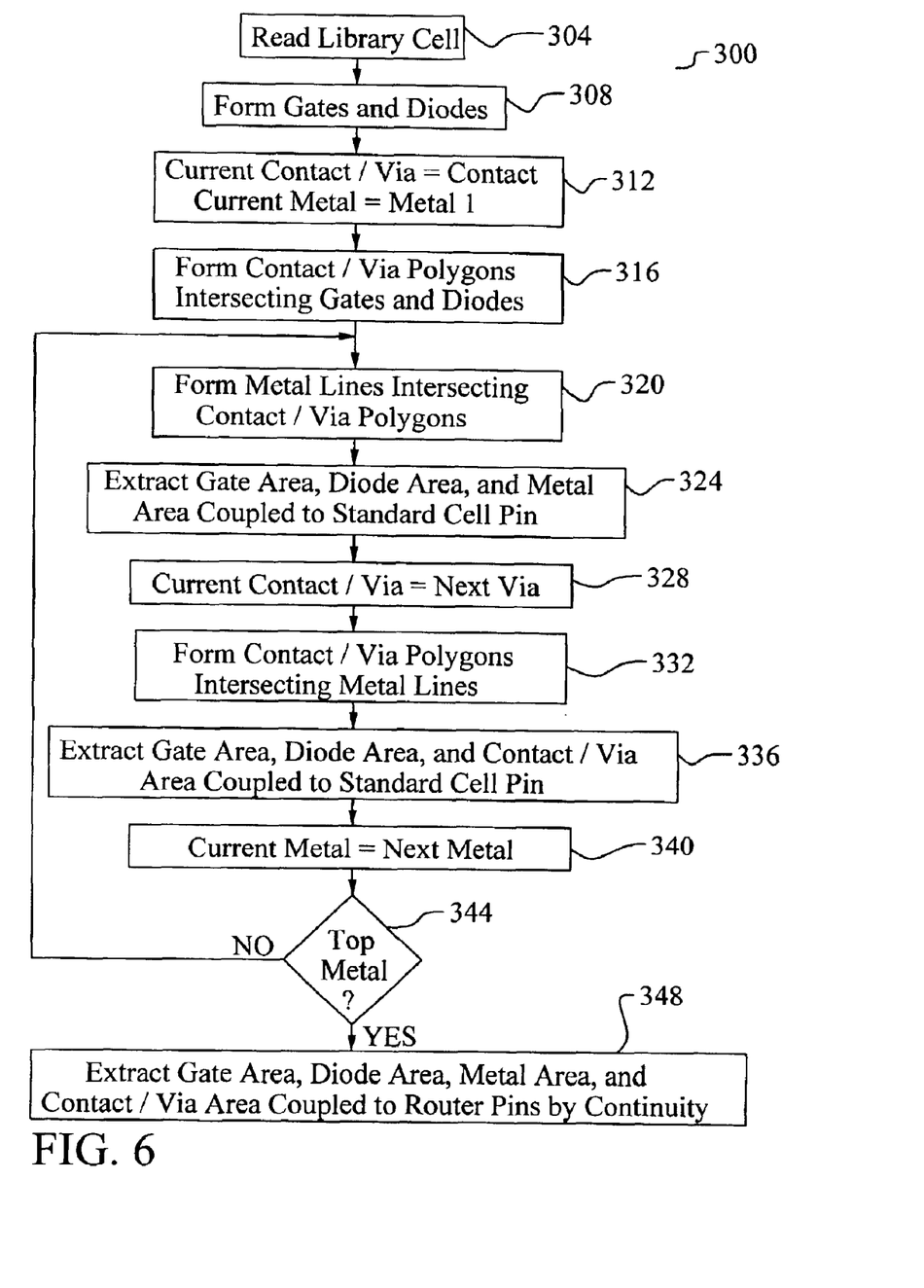
FIG. 6 illustrates the preferred embodiment of the present invention disclosing a method to determine parameters from the layout of a standard cell prior to placement and routing.

Referring now to FIG. 6, the preferred embodiment of the present invention is illustrated. Several important features of the present invention are shown and discussed below. A method 300 to determine parameters from the layout of a standard cell prior to placement and routing is described. It is understood that the method 300 may be applied to simple cells, such as logic gates, or to complex cells such as registers or counters. Further, the method 300 may be applied to blocks comprising a plurality of cells. Alternatively, the method may be applied to a custom circuit layout. In short, the method 300 may be applied to any circuit layout that can be placed into a chip-level layout and then routed to other placed circuits.

The method 300 comprises, first, reading a standard cell layout in step 304. Preferably, this layout will be in the form of a data file in a cell library. Typically, such layout data is stored in a standard, GDSII format. Reading the standard cell layout is understood by those skilled in the art as systematically decoding the contents of the GDSII file into a format that can be displayed or analyzed as a set of objects or polygons corresponding to a series of layers that are positioned with respect to a grid.

Gate and diode polygons are then formed in step 308. It is understood by those skilled in the art that the concept of forming herein means selecting a subset of the overall layout data for analysis or for display. The gate polygons may be selected, for example, by selecting the active area and then selecting the polysilicon gate layer. The intersection of the active area and the polysilicon layer on the layout grid will correspond to where MOS transistor gates are formed within the cell. The diode polygons can similarly be found by selecting the active area that does not intersect the polysilicon. These diode, or diffusion, polygons commonly correspond to MOS transistor drain and source regions.

The contact layer is designated as the current contact/via layer, and the lowest metal layer is designated as the current metal layer in step 312. This is an important step so that the cell can be systematically analyzed from the lowest interconnect layers to the highest. As discussed above, plasma charging can occur on any of the interconnect layers. Typically, an integrated circuit device will comprise multiple metal layers. For example, a fabrication process may comprise eight metal layers. In this case, the first metal layer (M1) is the lowest metal level in the stack. The first metal level is coupled to circuit structures, such as MOS gates and source/drain regions, by forming a contact opening through a dielectric layer to expose the desired contact object prior to the deposition of the first level metal. Traditionally, this first contact opening is formed in what is called the contact layer (CONTACT). The second metal level (M2) may likewise be coupled to the first metal level (M1) using a contact opening in the dielectric layer that otherwise isolates M1 and M2. However, these openings are traditionally called vias and are formed using the VIA layer. Therefore, for an eight-level metal process, the interconnect layer sequence is CONTACT, M1, VIA1, M2, VIA2, M3, VIA3, . . . M7, VIA7, and M8.

In the method disclosed in the present invention, it is therefore understood that references to contact/via layer are generic references to either the CONTACT level or the VIA level since each is a vertical interconnect opening. The context of the reference determines the meaning. At step 312, it is understood that an initialization is performed so that the analysis can begin at a "current" contact/via level of CONTACT and a "current" metal level of M1.

As an important feature, polygons are next formed in the current contact/via layer where the polygons intersect gates and diodes in step 316. These contact/via polygons will correspond to the CONTACT openings overlying either MOS gates or diode/diffusion regions.

As an important feature in the present invention, parameters are then extracted using a method comprising steps 320 through 344. First, lines are formed in the current metal layer intersecting the current contact/via layer polygons in step 320. During the first pass through steps 320 through 340, this current metal layer is the first metal level, M1. Any metal line intersecting one of the contact/via polygons that were selected in step 316 is selected for analysis in step 320. Note that these metal lines will be connected to the gates or to the diffusion regions because of the presence of these contact/via polygons. At this point, the novel method of the present invention has herein selected the gate polygons, the diode polygons, and the metal polygons that are coupled to either gate or diode polygons.

Next, in an important feature of the present invention, the gate area, the diode area, and the metal area are extracted where coupled to a pin of the standard cell in step 324. If the current metal layer is coupled to a input or an output pin of the standard cell, then it is desirable to have antenna effect parameters for that metal layer for the reasons outlined in the discussion of prior art. Therefore, in step 324, the area of the MOS gate or gates coupled to current metal layer is calculated, and the area of the diode or diodes coupled to the current metal layer is calculated.

The next contact/via layer is then designated as the new current contact/via layer in step 328. On the first pass through steps 320 through 340, this means that the current contact/via layer is incremented to VIA1. Polygons are then formed in the current contact/via layer intersecting the current metal layer in step 332. In other words, the polygons for the current contact/via layer are selected from the GDSII data and are kept if these polygons intersect current metal layer lines. These current contact/via polygons will correspond to openings to couple the current metal level to the metal level above it.

As an important feature, gate area, diode area, and contact/via area are then extracted where coupled to a pin of the standard cell. In this step, the gate area and diode area calculated for the current metal layer in step 324 can be further filtered so that only gates and diode regions that are further coupled to a higher level of interconnect will be selected. This is true since a gate or diode region must be coupled to the lower metal level in order to be coupled to the contact/via level above that metal level.

As an important step, the next metal layer is then designated as the new current metal layer in step 340. In this way, the analysis is initialized for the next level of metal. Finally, the analysis loop is completed by step 344 where the extracting of parameters is repeated until the current metal layer equals top metal layer.

As a final important step in the method 300, gate area, diode area, metal area and contact/via area are extracted where coupled to a pin of the standard cell. The purpose of the overall procedure 300 is to create a set of parameters: gate area, diode area, metal area, and contact/via area corresponding to each routing pin of the standard cell. Further, these parameters list the metal area and contact/via area segregated by metal level. Therefore, the gate areas, diode areas, metal areas, and contact/via areas generated by steps 320–340 must be further filtered such that only those areas coupled to each router pin are reported. Therefore, in step 348, the routing pin levels are determined and the selected metal lines from steps 320 through 340 are compared to see if they match. If metal continuity can be established, then the gate area, diode area, metal area, and contact/via area of each metal layer coupled to the routing pin is reported as calculated. If no such continuity is established, then the gate area, diode area, metal area, and contact/via area is nulled for all levels for that cell routing pin.

Figure 7:
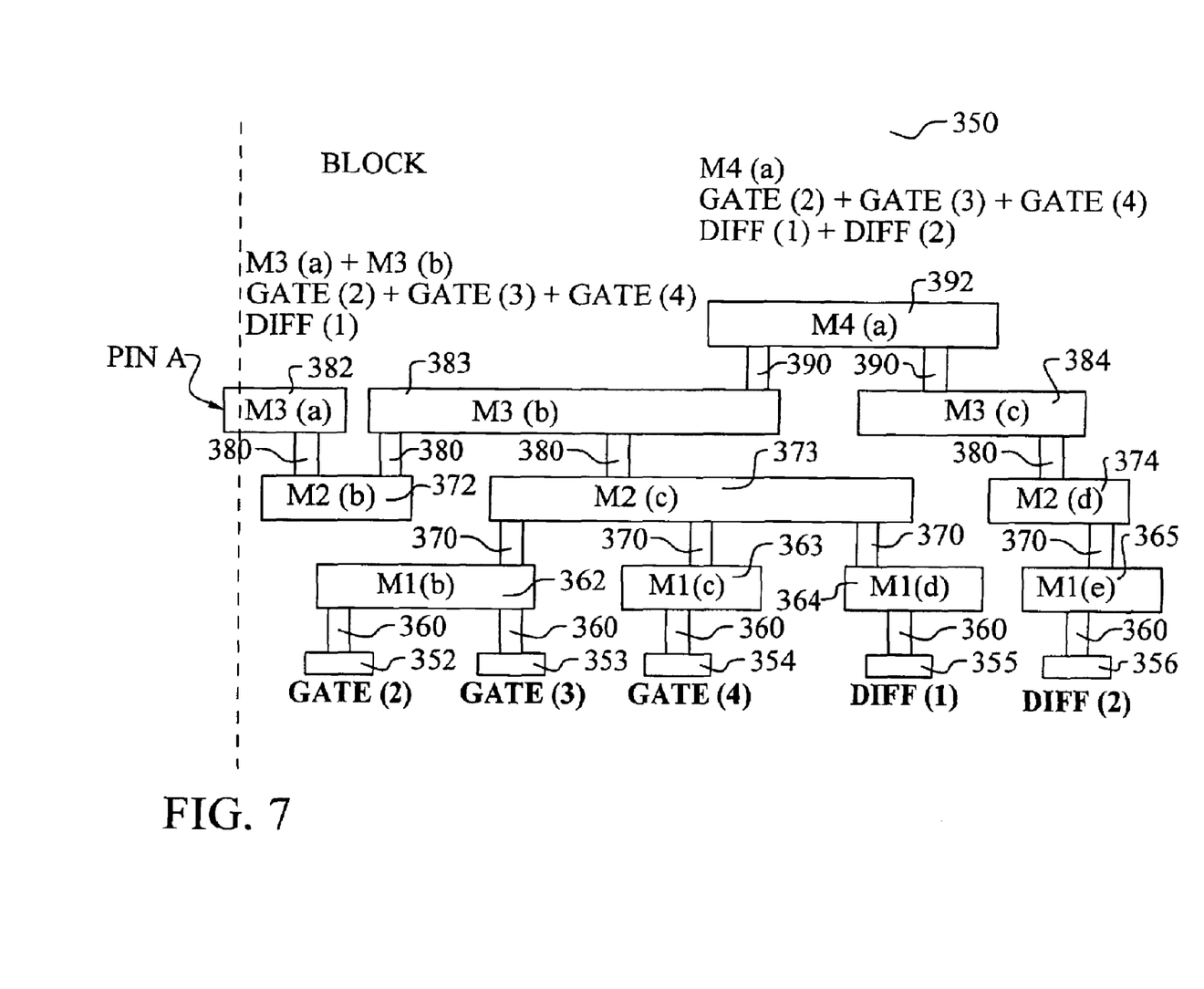
FIG. 7 illustrates a cross section of a standard cell, or block, along with the results of the parametric analysis method of the present invention.

Referring now to FIG. 7, a cross section of a standard cell, or block, 350 is shown along with the results of the parametric analysis method of the present invention. Pin A is a routing pin for this block 350. The block contains several gates, diffusion regions, and multiple levels of interconnect. The results of the analysis are shown. Note first that no data is reported for the M1 and M2 levels. This is because the routing pin coupling is formed in the M3 level. It does not matter if plasma charging occurs during processes prior to M3 formation. Therefore, the metal and contact/via areas for M1 and M2 can be ignored. For M3, the analysis revealed that three gates, GATE(2) 352, GATE(3) 353, AND GATE (4) 354 are coupled to the M3 line 382 that is further coupled to Pin A. In addition, one of the diffusion regions, DIFF(1) 355 is also coupled to the M3($a$) line 382 and to Pin A. Note that the coupling is indirect because M2 sections (b) 372 and (c) 373 are used to form the coupling. It is this type of internal connectivity that the prior art cannot accurately assess. Note that the second diffusion region, DIFF(2) 356, is not detected as coupled to Pin A through the M3 layer. This is because the coupling path uses the M4 level 392. During the plasma etching process wherein M3 is exposed, the M4 level will not have yet been formed. Therefore, this charging path is not counted. This is why the analysis method begins at the lowest metal/via level and proceeds upward. However, DIFF(2) 356 is added to the diffusion area for the M4 level coupled to Pin A.

The reported data from the method of the present invention provides the gate area, diode area, metal area, and contact/via area coupled to the routing pin. This data is further segregated by metal/via level such that an accurate antenna effect ratio can be calculated for any proposed signal routing that is attached to the routing pin. Note that this parametric data can be accessed directly by the routing program without requiring any analysis of the actual standard cell GDSII layout data by the routing program. It is preferred that the parameters be stored in a format that is compatible with the library modeling function of the routing program.

Figure 8:
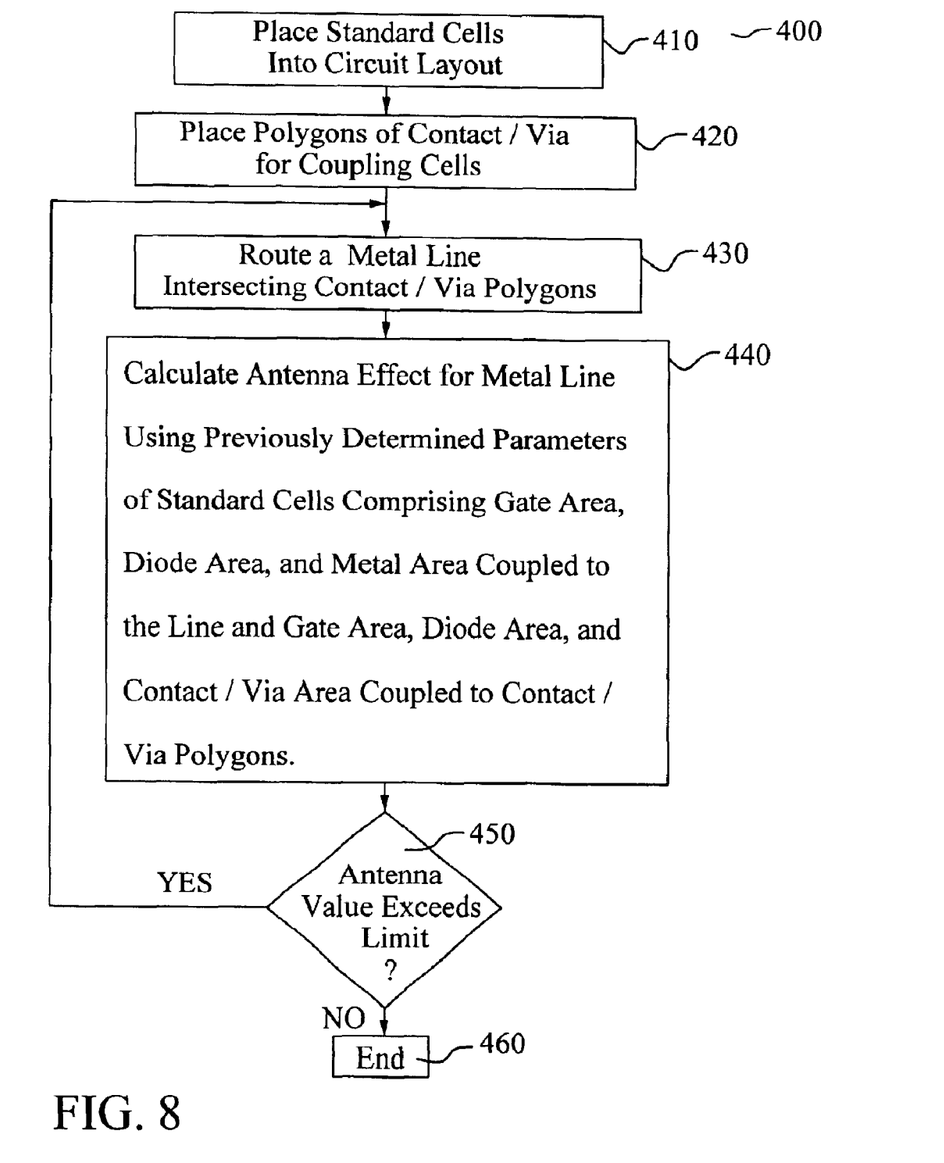
FIG. 8 illustrates a preferred embodiment method of routing a signal in a standard cell-based integrated circuit device.

Referring now to FIG. 8, a preferred embodiment method 400 of routing a signal in a standard cell-based integrated circuit device is illustrated. The method 400 comprises, first, providing a layout for an integrated circuit device comprising an array of placed standard cells in step 410. Contact/via layer polygons are then placed for coupling the standard cells in 420. A line is then routed in a metal layer in step 430. An antenna effect value is calculated for the line using parameters previously determined from the layout of each the standard cell in step 440. The parameters comprise gate area, diode area, metal area, and contact/via area coupled to the line as described in the parameter extraction method above. These parameters are preferably in a format for use by the library model module of the routing program. The gate area, the diode area, the metal area, and the contact/via area are segregated by metal level as described above. The steps of routing and calculating are then repeated if the antenna effect value exceeds a specified value as verified in step 450. This method 400 of routing a signal may be repeated for every signal in the chip-level circuit. By using the improved parameters provided by the extraction procedure of the present invention, more accurate antenna effect ratios and limits will be calculated by the routing program. As a result, the router will be able to route lines that have a low antenna ratio very aggressively, and save routing time. At the same time, problem routes can be detected more accurately. As a result, the router will create better signal routes, faster, and will pass the final DRC checking with greater frequency.

The advantages of the present invention may now be summarized. An effective method to route metal lines in a standard cell integrated circuit device is achieved. Plasma-induced EOS and ESD damage is avoided by controlling the antenna effect in the routing of metal lines in a standard cell circuit device. The antenna effect is reduced by pre-determining effect parameters in the standard cell layout prior to placement and routing and then passing these parameters to the routing program. Parameters such as gate area, diode area, metal area, and contact/via area are provided for each metal and contact/via layer to thereby improve the quality of antenna effect ratio calculations by the router. A method is provided to route signal lines whereby the antenna effect calculation has improved accuracy to enable improved routing performance. The method to route signal lines will improve the efficiency of the automatic router and will improve the pass rate during final DRC checking.

As shown in the preferred embodiments, the novel method of the present invention provides an effective and manufacturable alternative to the prior art.

While the invention has been particularly shown and described with reference to the preferred embodiments thereof, it will be understood by those skilled in the art that various changes in from and details may be made without departing from the spirit and scope of the invention.

What is claimed is:

1. A method to route a metal line in the layout of an integrated circuit device comprising:
   providing a layout for an integrated circuit device comprising an array of placed standard cells;
   placing polygons of a contact/via layer for coupling said standard cells;
   routing a line in a metal layer intersection said polygons;
   calculating an antenna effect value for said line using parameters previously determined from the layout of each said standard cell wherein said parameters comprise gate area, diode area, metal area, and contact/via area coupled to said line wherein said gate area, said diode area, said metal area, and said contact/via area are segregated by metal level; and
   repeating said steps of routing and calculating if said antenna effect value exceeds a specified value.

2. The method according to claim 1 wherein said parameters from the layout of each said standard cell are previously determined by a method comprising:
   reading a layout of said standard cell;
   forming gate and diode polygons;
   designating contact layer as current contact/via layer and lowest metal layer as current metal layer;
   thereafter forming polygons in said current contact/via intersecting said gates and said diodes;
   thereafter extracting said parameters using a method comprising:
      forming lines in said current metal layer intersecting said current contact/via layer polygons;
      thereafter extracting said gate area, said diode area, and said metal area coupled to a pin of said standard cell;
      thereafter designating next contact/via layer as new said current contact/via layer;
      thereafter forming polygons in said current contact/via layer intersecting said current metal layer;
      thereafter extracting said gate area, said diode area, and said contact/via area coupled to a pin of said standard cell;
      thereafter designating next metal layer as new said current metal layer; and
   repeating said step of extracting said parameters until said current metal layer equals top metal layer; and
   extracting said gate area, said diode area, said metal area, and said contact/via area coupled to a pin of said standard cell.

3. The method according to claim 2 further comprising translating said parameters into a format for use by an automatic router.

4. The method according to claim 2 wherein said standard cell layout comprises a GDSII format file.

5. The method according to claim 1 wherein said standard cells comprise sub-cells of standard cells.

6. The method according to claim 1 wherein said step of calculating comprises determining a ratio of a metal sidewall area to said gate area wherein said metal sidewall area comprises a sum of said line and said standard cell metal area of said metal layer and wherein said specified value is proportional to said standard cell diode area.

7. The method according to claim 6 wherein said standard cell diode area is nulled if below a minimum value.

8. The method according to claim 1 wherein said metal layer comprises one of a plurality of metal layers.

9. A method to route a metal line in the layout of an integrated circuit device comprising:
   providing a layout for an integrated circuit device comprising an array of placed standard cells;
   placing polygons of a contact/via layer for coupling said standard cells;
   routing a line in a metal layer intersecting said polygons;

calculating an antenna effect value for said line using parameters previously determined from the layout of each said standard cell wherein said parameters comprise gate area, diode area, metal area, and contact/via area coupled to said line wherein said gate area, said diode area, said metal area, and said contact/via area are segregated by metal level and wherein said parameters are determined by a method comprising:

reading a layout of said standard cell;

forming gate and diode polygons;

designating contact layer as current contact/via layer and lowest metal layer as current metal layer;

thereafter forming polygons in said current contact/via layer wherein said polygons intersect said gates and said diodes;

thereafter extracting said parameters using a method comprising:

forming lines in said current metal layer intersecting said current contact/via layer polygons;

thereafter extracting said gate area, said diode area, and said metal area coupled to a pin of said standard cell;

thereafter designating next contact/via layer as new said current contact/via layer;

thereafter forming polygons in said current contact/via layer intersecting said current metal layer;

thereat extracting said gate area, said diode area, and said contact/via area coupled to a pin of said standard cell;

thereafter designating next metal layer as new said current metal layer; and repeating said step of extracting said parameters until said current metal layer equals top metal layer; and extracting said gate area, said diode area, said metal area, and said contact/via area coupled to a pin of said standard cell; and repeating said steps of routing and calculating if said antenna effect value exceeds a specified value.

10. The method according to claim 9 further comprising translating said parameters into a format for use by an automatic router.

11. The method according to claim 9 wherein said standard cell layout comprises a GDSII format file.

12. The method according to claim 9 wherein said standard cells comprise sub-cells of standard cells.

13. The method according to claim 9 wherein said step of calculating comprises determining a ratio of a metal sidewall area to said gate area wherein said metal sidewall area comprises a sum of said line and said standard cell metal area of said metal layer and wherein said specified value is proportional to said standard cell diode area.

14. The method according to claim 9 wherein said standard cell diode area is nulled if below a minimum value.

15. The method according to claim 9 wherein said metal layer comprises one of a plurality of metal layers.

16. A method to determine parameters from the layout of a standard cell prior to placement and routing comprising:

reading a standard cell layout;

forming gate and diode polygons;

designating contact layer as current contact/via layer and lowest metal layer as current metal layer, thereafter forming polygons in said current contact/via layer wherein said polygons intersect gates and diodes;

thereafter extracting parameters using a method comprising:

forming lines in said current metal layer intersecting said current contact/via layer polygon;

thereafter extracting gate area, diode area, and metal area coupled to a pin of said standard cell;

thereafter designating next contact/via layer as new said current contact/via layer;

thereafter forming polygons in said current contact/via layer intersecting said current metal layer;

thereafter extracting gate area, diode area, and contact/via area coupled to a pin of said standard cell;

thereafter designating next metal layer as new said current metal layer, and repeating said step of extracting said parameters until said current metal layer equals top metal layer; and extracting said gate area, said diode area, said metal area, and said contact/via area coupled to a pin of said standard cell.

17. The method according to claim 16 further comprising translating said parameters into format for all automatic router.

18. The method according to claim 16 wherein said standard cell layout comprises a GDSII format file.

19. The method according to claim 16 wherein said standard cells comprise sub-cells of standard cells.

20. The method according to claim 16 wherein said parameters enable calculation of an antenna effect value by placement and routing software.

* * * * *

UNITED STATES PATENT AND TRADEMARK OFFICE
CERTIFICATE OF CORRECTION

PATENT NO. : 6,862,723 B1
DATED : March 1, 2005
INVENTOR(S) : Wang et al.

It is certified that error appears in the above-identified patent and that said Letters Patent is hereby corrected as shown below:

Column 11,
Line 27, please delete the word "thereat" and insert the word -- thereafter --.

Signed and Sealed this

Thirtieth Day of August, 2005

JON W. DUDAS
*Director of the United States Patent and Trademark Office*